US012733102B2

(12) United States Patent
Varieur et al.

(10) Patent No.: US 12,733,102 B2
(45) Date of Patent: Sep. 8, 2026

(54) SPRING BRACKET AND SENSOR DEVICE INCLUDING SAME

(71) Applicant: Johnson Controls Fire Protection LP, Boca Raton, FL (US)

(72) Inventors: Steven T. Varieur, Boca Raton, FL (US); Joseph Farley, Boca Raton, FL (US); John B. Stowell, Boca Raton, FL (US)

(73) Assignee: Johnson Controls Fire Protection LP, Boca Raton, FL (US)

( * ) Notice: Subject to any disclaimer, the term of this patent is extended or adjusted under 35 U.S.C. 154(b) by 337 days.

(21) Appl. No.: 18/030,457

(22) PCT Filed: Oct. 6, 2021

(86) PCT No.: PCT/US2021/071745

§ 371 (c)(1),
(2) Date: Apr. 5, 2023

(87) PCT Pub. No.: WO2022/077002

PCT Pub. Date: Apr. 14, 2022

(65) Prior Publication Data

US 2023/0389181 A1 Nov. 30, 2023

Related U.S. Application Data

(60) Provisional application No. 63/088,780, filed on Oct. 7, 2020.

(51) Int. Cl.
*H05K 1/18* (2026.01)
*G08B 17/113* (2006.01)

(52) U.S. Cl.
CPC .............. *H05K 1/18* (2013.01); *G08B 17/113* (2013.01); *H05K 2201/10151* (2013.01); *H05K 2201/105* (2013.01); *H05K 2201/10962* (2013.01)

(58) Field of Classification Search
CPC ........... H05K 1/18; H05K 2201/10151; H05K 2201/105; H05K 2201/10962; G08B 17/113
See application file for complete search history.

(56) References Cited

U.S. PATENT DOCUMENTS 4,250,536 A * 2/1981 Barringer ............... H05K 1/144 439/74
4,689,719 A * 8/1987 Prussas ............... H01L 23/3672 361/803

(Continued)

FOREIGN PATENT DOCUMENTS

DE 102015202142 A1 8/2016
JP 2009186392 A * 8/2009 ............ F16C 33/723
NO 327376 B1 6/2009

OTHER PUBLICATIONS

Translation of NO327376.*

(Continued)

*Primary Examiner* — Helen C Kwok
(74) *Attorney, Agent, or Firm* — ArentFox Schiff LLP

(57) ABSTRACT

A bracket for holding a sensor at a location on a circuit board. The bracket comprises a main body and at least two leg members. Each leg member further includes a first end connected to the main body and a second end extending away from the main body at a predetermined angle. In an engaged position of the bracket, the second end of each leg member is configured to extend through a corresponding opening in the circuit board and wherein each second end further comprises a hook member configured to engage a bottom portion of the circuit board in the engaged of the bracket. The bracket further includes at least one spring member having a first surface configured to contact a top (Continued)

portion of the sensor and exert a force substantially normal to the circuit board in the engaged position of the bracket.

20 Claims, 18 Drawing Sheets

(56) References Cited

U.S. PATENT DOCUMENTS 4,978,307 A * 12/1990 Billman ................. H01R 12/58
439/83
5,104,324 A * 4/1992 Grabbe .................. H01R 12/83
439/876
5,695,353 A * 12/1997 Sakata ................... H01R 12/83
439/326
5,801,929 A 9/1998 Cheng
5,908,333 A * 6/1999 Perino ................ H01R 12/7076
439/631
2003/0112607 A1* 6/2003 Clark ..................... H01R 12/52
361/736
2011/0299288 A1* 12/2011 Rapisarda ............ H05K 1/0203
362/351
2013/0286669 A1* 10/2013 Moser ................. F21V 19/0025
362/382
2016/0233597 A1* 8/2016 Binder ................. H05K 7/2049
2018/0115027 A1* 4/2018 Hammerschmied .........................
H01M 50/581
2021/0194159 A1* 6/2021 Gruber ................... H01R 12/73

OTHER PUBLICATIONS

Translation of JP2009186392.*

International Search Report and Written Opinion, mailed on Feb. 1, 2022, in related International Patent Application No. PCT/US2021/071745, international filing date Oct. 5, 2021.

* cited by examiner 100
122
902
110
104
154
126
108
112
128
124
106

SPRING BRACKET AND SENSOR DEVICE INCLUDING SAME

CROSS REFERENCE TO RELATED APPLICATIONS

The present Application for Patent is a 35 U.S.C. § 371 National Phase of PCT Application No. PCT/US2021/071745, filed on Oct. 6, 2021, which claims priority to U.S. Provisional Application No. 63/088,780, entitled "Spring Bracket," filed on Oct. 7, 2020, both of which are assigned to the assignee hereof and hereby expressly incorporated by reference in their entireties.

BACKGROUND

Aspects of the present disclosure relate generally to a bracket, and more particularly to a bracket having a spring force for mounting a sensor to a sensor device. One example implementation, which should not be construed as limiting, is a spring bracket for use in a smoke detector. The smoke detector may include a multi-sensor smoke detector, which may have some combination of smoke, heat and carbon monoxide (CO) sensors. A typical way to hold a CO sensor (or cell) is with a spring, however, the spring takes up a lot of room and must be soldered to the PCB.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, the present disclosure concerns a bracket for holding a sensor at a location on a circuit board. The bracket comprises a main body and at least two leg members. Each of the at least two leg members further includes a first end connected to the main body and a second end extending away from the main body at a predetermined angle, wherein, in an engaged position of the bracket, the second end of each of the at least two leg members is configured to extend through a corresponding opening in the circuit board and wherein the second end further comprises a hook member configured to engage a bottom portion of the circuit board in the engaged position of the bracket. The bracket further includes at least one spring member, wherein the at least one spring member has a first surface configured to contact a top portion of the sensor and exert a force substantially normal to the circuit board in the engaged position of the bracket.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
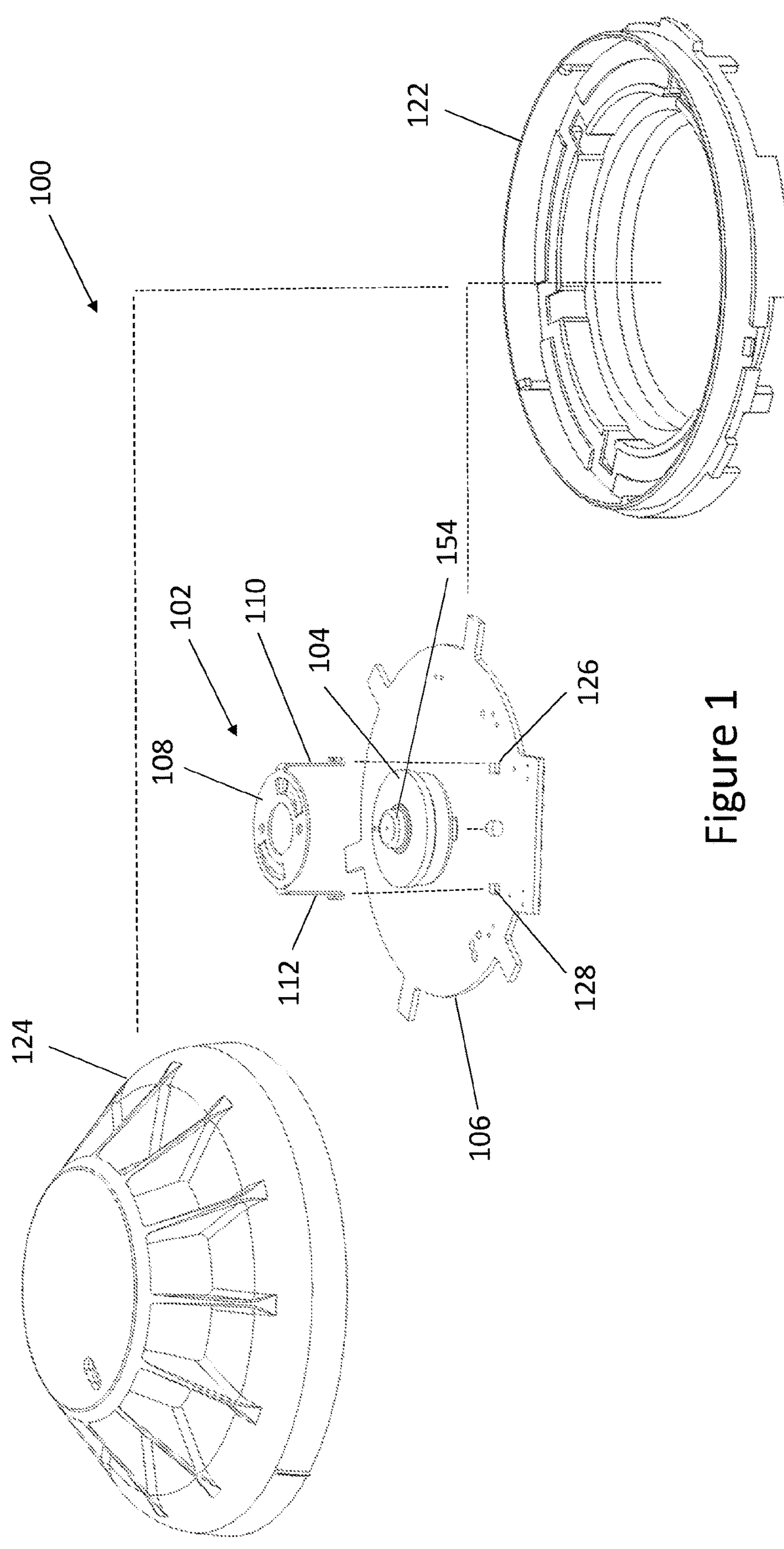
FIG. 1 is an exploded top perspective view of an example spring bracket configured to mount a sensor on a circuit board that is held within first and second housings of a sensor device.
Figure 2:
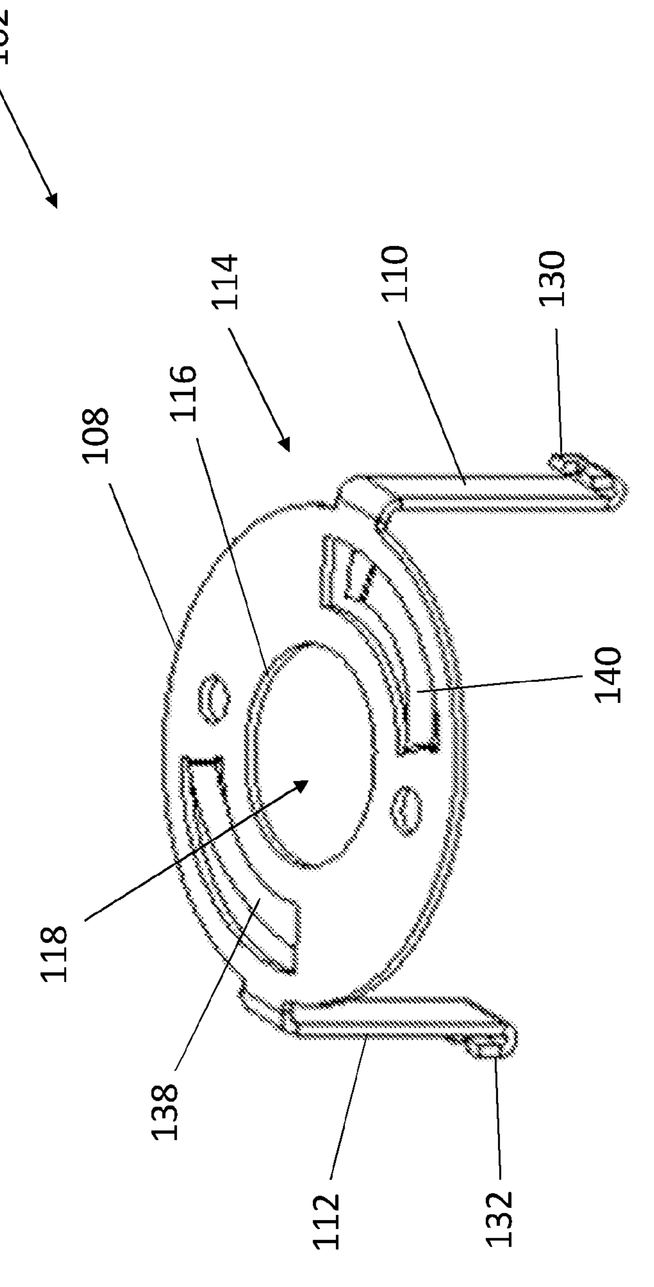
FIG. 2 is a top perspective view of the spring bracket of FIG. 1.
Figure 3:
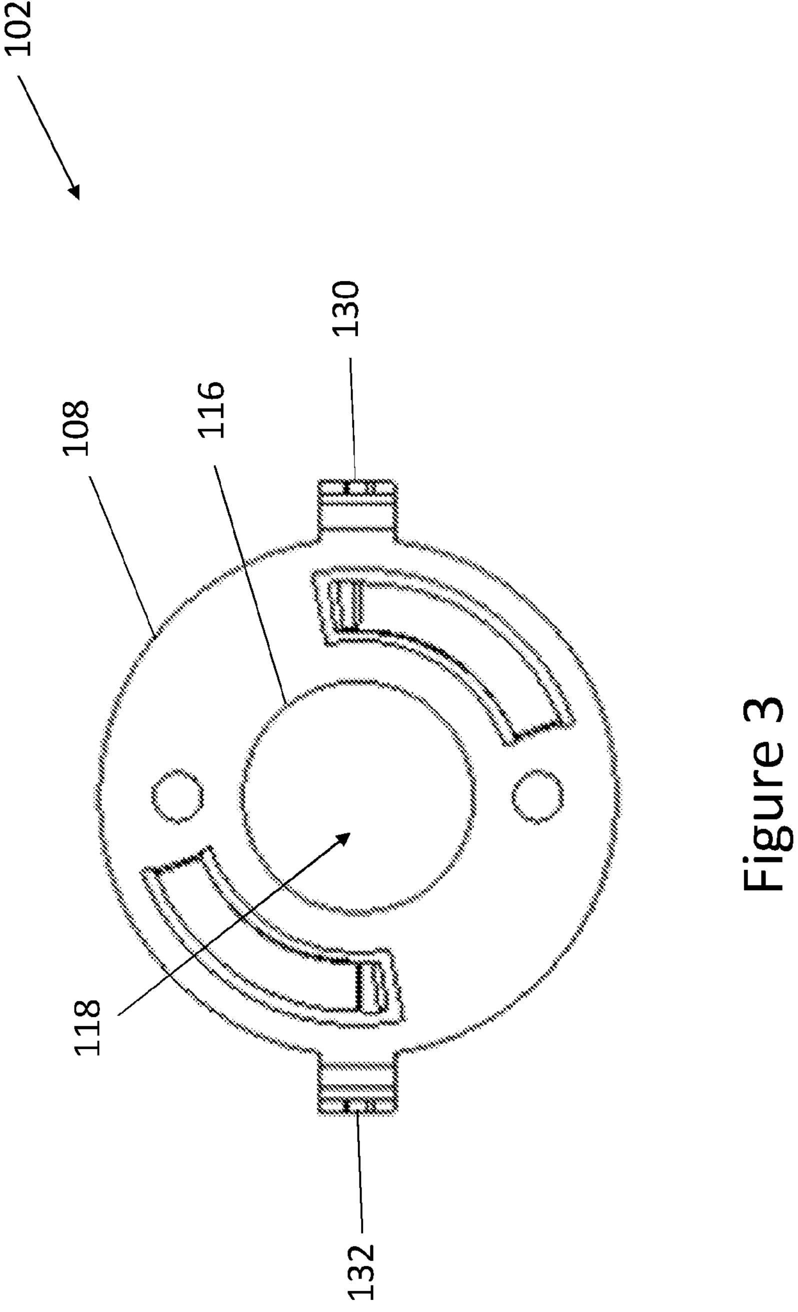
FIG. 3 is a top view of the spring bracket of FIG. 1.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

The present disclosure provides a spring bracket that is able to simply and efficiently hold a sensor to a circuit board. The spring bracket herein overcomes certain drawbacks of the currently known conventional techniques, such as but not limited to avoiding the need to solder a spring clip to the circuit board, reducing a footprint on the circuit board for the mechanism holding the sensor, and improving an ease of assembly and/or disassembly/replacement.

Referring to FIGS. 1-8 and 9-16, respectively, a sensor device 100 includes a bracket 102 or 902, respectively, configured to hold a sensor 104 at a location on a circuit board 106. The sensor 104 may include, but is not limited, a carbon monoxide (CO) sensor or cell, a smoke sensor, a heat sensor, or any other type of sensor. The bracket 102, 902 includes a main body 108 with at least two leg members 110, 112 extending therefrom to engage the circuit board 106 and at least one spring member 114 to apply a spring force to hold the sensor 104 against the circuit board 106 when the bracket 102, 902 is in an engaged position with the circuit board 106. The sensor 104 includes a top side configured to engage with the bracket 102, 902, and a bottom side configured to engage with the circuit board 106. In some cases, the top side of the sensor 104 may include a raised portion 154 and correspondingly the main body 108 of the bracket 102, 902 may include an inner wall 116 that defines an opening 118 sized to allow the raised portion 154 of the sensor 104 to partially or fully extend through the main body 108. In an aspect, the at least one spring member 114 extends from the main body 108, such as one or more leaf springs (see FIG. 1), and/or is defined by the main body 108, such as based on an elastic characteristic of the main body 108 (see FIG. 9).

The at least two leg members 110, 112 of the bracket 102, 902 are each connected to the main body 108 at a first end and extend away from the main body 108 at a second end. The second end of one or both of the at least two leg members 110, 112 further comprises a respective hook member 130, 132 (FIG. 2) or 930, 932 (FIG. 10) configured to engage a bottom side 152 (FIGS. 6*a*-*b* and 14*a*-*b*) of the circuit board 106 when the bracket 102, 902 is in a engaged position. For example, referring to FIGS. 6*a*-*b* to 8 and 14*a*-*b* to 16, the respective hook members 130, 132 or 930, 932 make electrical contact with electrical contact pads 134, 136 on a bottom side 152 of the circuit board 106 when the bracket 102, 902 is in the engaged position. For example, the electrical contact pads 134, 136 may be electrically connected to one or more electrical traces associated with one or more circuits 158 (represented by a dashed line) on the circuit board 106.

In some aspects, all or a portion of the bracket 102, 902 may be formed from an electrically conductive material, and an electrical connection is made between electrical contacts on a top side of the sensor 104, through the bracket 102, 902 and the contact pads 134, 136 to the one or more circuits 158 on the circuit board 106. Suitable materials for the bracket 102, 902, may include, but are not limited to, copper, steel, stainless steel, gold, nickel, etc., including plating variants (phosphorus, bronze, gold, etc.) or any other electro-conductive material or combination of materials. In an alternative or additional implementation, the spring force applied by the bracket 102, 902 to the sensor 104 may be sufficient to maintain electrical contact between corresponding contact pads on a bottom 152 of the sensor 104 and the top of the circuit board 106, thereby connecting to the one or more circuits 158 on the circuit board 106.

In an aspect, in the engaged position of the bracket 102, 902 and the circuit board 106 holding the sensor 104, the assembly is configured to provide an electrical connection between the sensor 104 and the circuit board 106 to provide a sensor-triggered function actuated by the sensor device 100. For example, the sensor-triggered function may include, but is not limited to, actuating one or more other components electrically connected to the circuit board 106 through one or more circuits 158 to indicate the sensor 104 has detected a condition, e.g., presence of an amount of CO, smoke, or heat over a respective threshold. For instance, the one or more other components may be a speaker, and the sensor-triggered function may include sounding an alarm or broadcasting a message from the speaker based on detecting the condition. Alternatively, or in addition, the one or more other components may be one or more lights, and the sensor-triggered function may include turning on the one or more lights based on detecting the condition. Alternatively or additionally, the one or more other components may be a communication device, such as a modem, and the sensor-triggered function may include transmitting a notification signal from the communication device via a wired or wireless connection to a monitoring device, such as a security and/or fire control panel, and/or a mobile electronic device such as a cell phone. In this case, the notification signal may indicate to the monitoring device that the sensor 104 has detected the condition.

Referring more specifically to FIGS. 5-8 and 13-16, in order to removably lock the sensor 104 to the circuit board 106, the sensor 104 is positioned onto the circuit board 106 and the bracket 102, 902 is then placed over the top of the sensor 104. In the case where the sensor 104 includes a raised portion 154 on a top side, the raised portion 154 then extends through the opening 118 as discussed above and the at least two leg portions 110, 112 extend through openings 126, 128 defined by internal walls of the circuit board 106. As the at least two leg members 110, 112 extend through openings in the circuit board 126, 128 the spring member 114 engages the top side exerting a force which presses the sensor 104 into the circuit board 106. The respective hook members 130, 132 or 930, 932 correspondingly engage the bottom side 152 of the circuit board 106 and exert a force opposite of that of the spring member 114. More specifically, in the aspect of FIGS. 1 and 5-8, the at least two leg portions 110, 112 of the bracket 102 are squeezed closer to one another as they are extended through openings 126, 128, and then released so that ends of the respective hook members 130, 132 contact electrical contact pads 134, 136 on bottom side 152 of the circuit board 106. In the aspect of FIGS. 9 and 13-16, the bracket 902 is rotated after inserting the at least two leg portions 110, 112 through openings 126, 128, such that the respective hook members 930, 932 are wedged into a thickness of the circuit board 106 and contact electrical contact pads 134, 136 on bottom side 152 of the circuit board 106. Therefore as the spring member 114 presses the sensor 104 into place on the circuit board 106, the respective hook members 130, 132 or 930, 932 keep the spring member 114 in the engaged position and prevent the bracket 102, 902 from moving away from the sensor 104, thereby locking the sensor 104 into place and into electrical contact with one or more circuits 158 on the circuit board 106.

Figure 9:
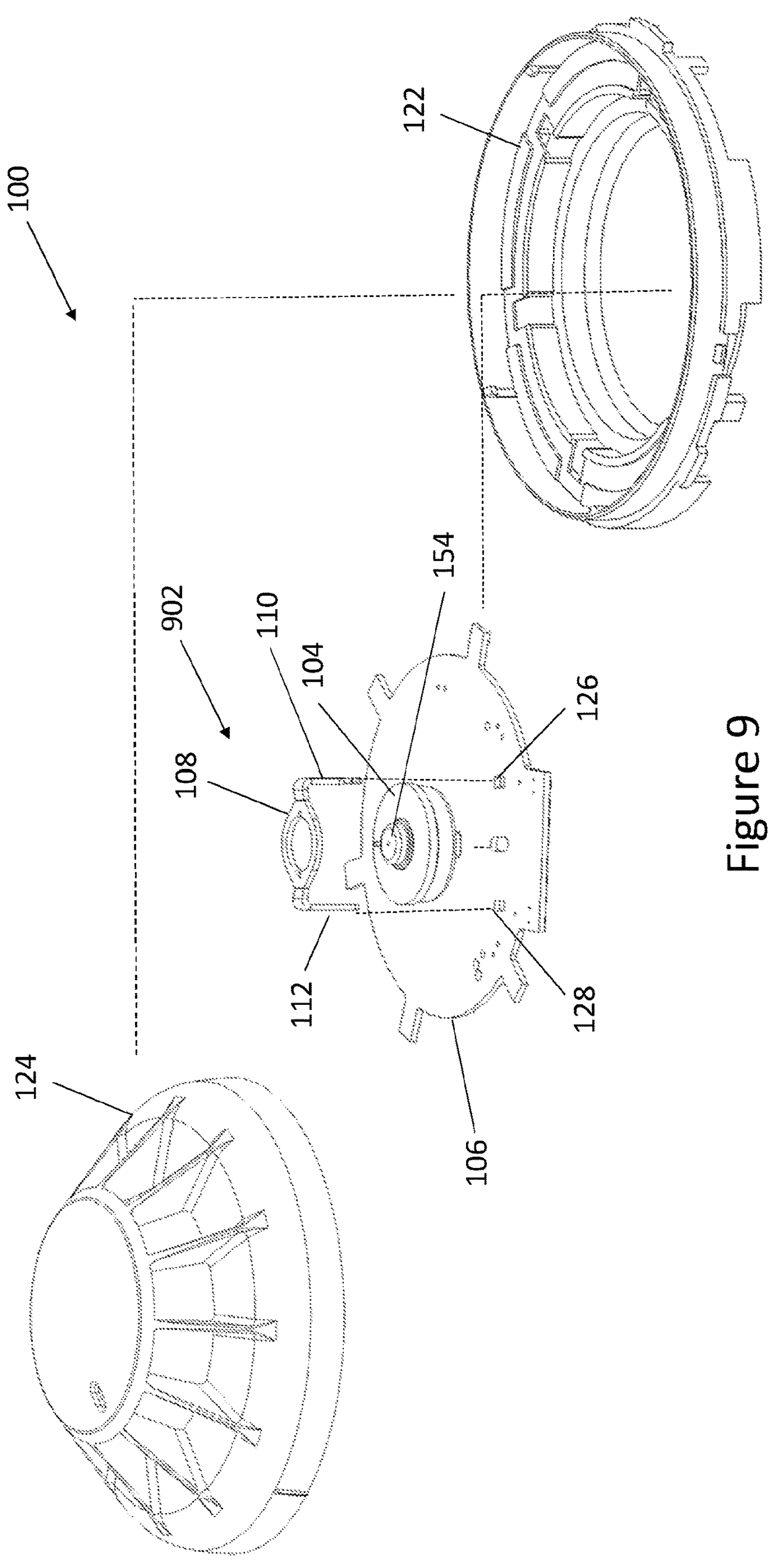
FIG. 9 is an exploded top perspective view of another example spring bracket configured to mount a sensor on a circuit board that is held within first and second housings of a sensor device.

In some aspects, referring specifically to FIGS. 1 and 9, the sensor device 100 may include a sensor device housing, including a sensor base 122 and a sensor cover 124, which is configured to enclose the sensor 104 and thereby protect the sensor 104 from damage and/or to provide an attractive look to the sensor device 100. For example, the sensor base 122 and the sensor cover 124 are shaped such that in an engaged position, an internal chamber is formed having a size to accommodate the sensor 104 and/or the circuit board 106. The sensor base 122 includes one or more mounting surfaces on an inner or outer side thereof to receive and/or hold the circuit board 106 and the sensor cover 124. For example, the circuit board 106 and/or the sensor cover 124 may be removably or permanently fixed to the sensor base 122 using one or more fixation elements, such as but not limited to one or more of a screw, a force fit such as interconnecting tabs and grooves, glue, or any other such fixation mechanisms. The sensor cover 124 includes an exterior side and an interior side, one or both of which may include one or more mounting surfaces configured to engage with the sensor base 122 for permanently or removably affixing the sensor cover 124 to the sensor base 122, as mentioned above. The sensor cover 124 may have one or more internal walls that define through holes in the sensor cover 124 to allow fluid, e.g., air, smoke, etc., to flow through the sensor cover 124 to be detected by the sensor 104. The sensor base 122 and the sensor cover 124 may be made out of any material that does not interfere with operation of the sensor 104. Suitable materials for the sensor base 122 and the sensor cover 124 include, but are not limited to, a plastic, a composite, or a metal.

Figure 4B:
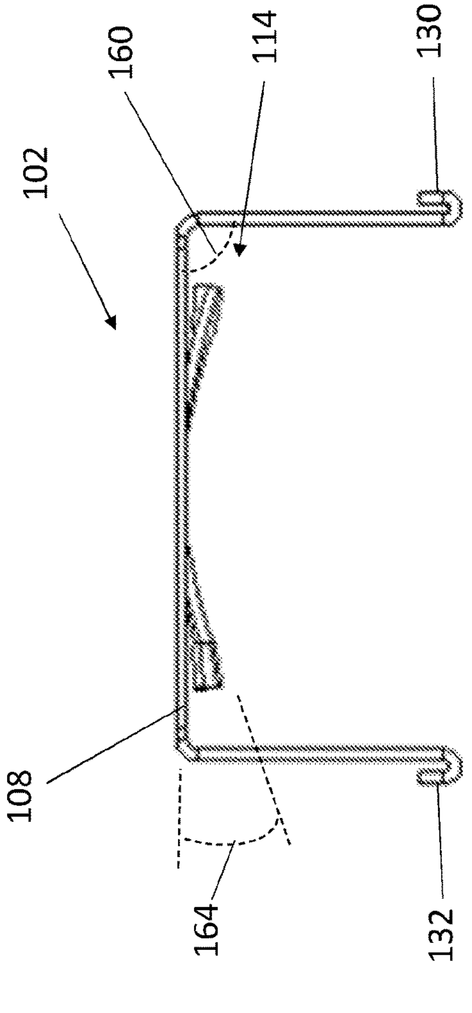
FIG. 4*b* is a front view of the spring bracket of FIG. 1.
Figure 4A:
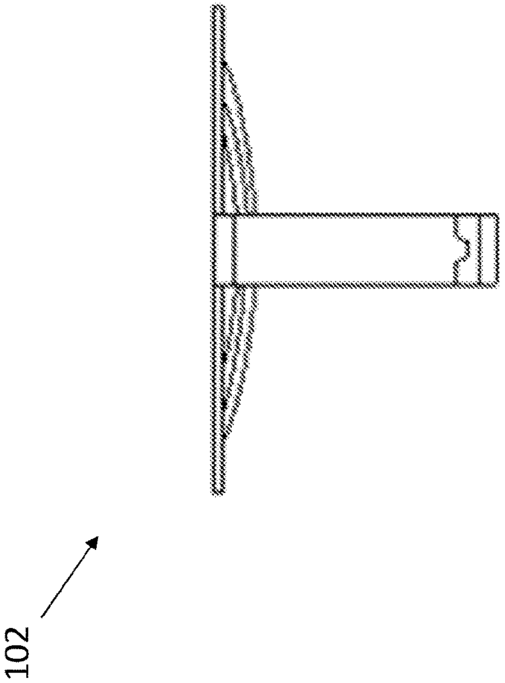
FIG. 4*a* is a side view of the spring bracket of FIG. 1.

As mentioned above, in the aspect of FIGS. 1-8, the at least one spring member 114 includes a first and second curved leaf spring 138, 140 extending away from the main body 108 of the bracket 102, 902 at a first angle 164 (FIG. 4*b*) in an unengaged position. The first and second leaf springs 138, 140 are configured to engage the top side of the sensor 104 when the bracket 102, 902 is in the engaged position with the circuit board 106. Further, in this aspect, the at least two leg members 110, 112 extend away from the bracket at an first angle 160 (e.g., in an unengaged or free position, see FIG. 4*b*) substantially normal to the main body 108 of the bracket 102, 902 and the corresponding hook members 130, 132 extend in an outward direction away from the main body 108. The hook members 130, 132 each include a first curved portion that extends in a direction substantially perpendicular to their respective leg members 110, 112 and a second planar portion that extends in an upward direction, toward the main body 108, thereby forming a hook or "J" shape as can be seen in FIG. 4*b*.

Figure 5:
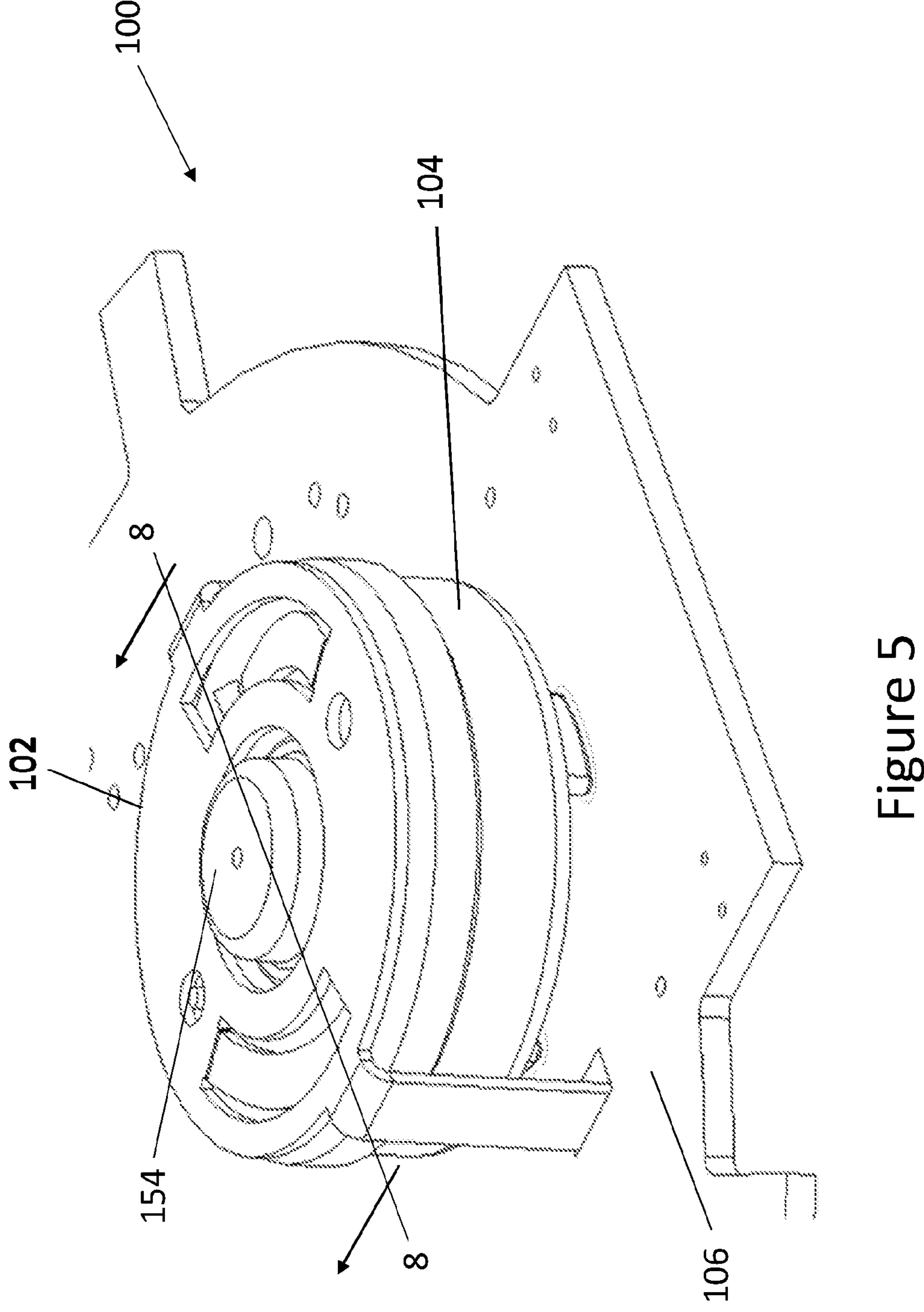
FIG. 5 is a close-up, cut-away top perspective view of the spring bracket, sensor, and circuit board of FIG. 1.
Figure 6A:
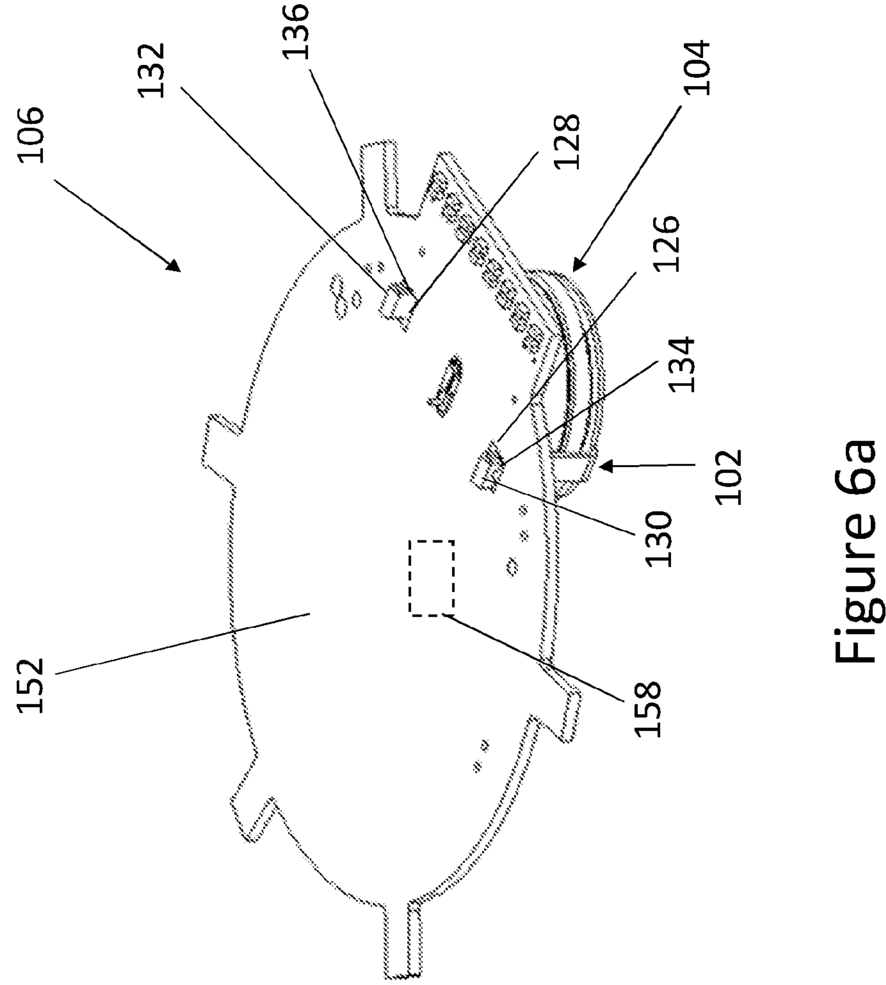
FIG. 6*a* is a bottom perspective view of the assembled state of the spring bracket, sensor, and circuit board of FIG. 1.
Figure 6B:
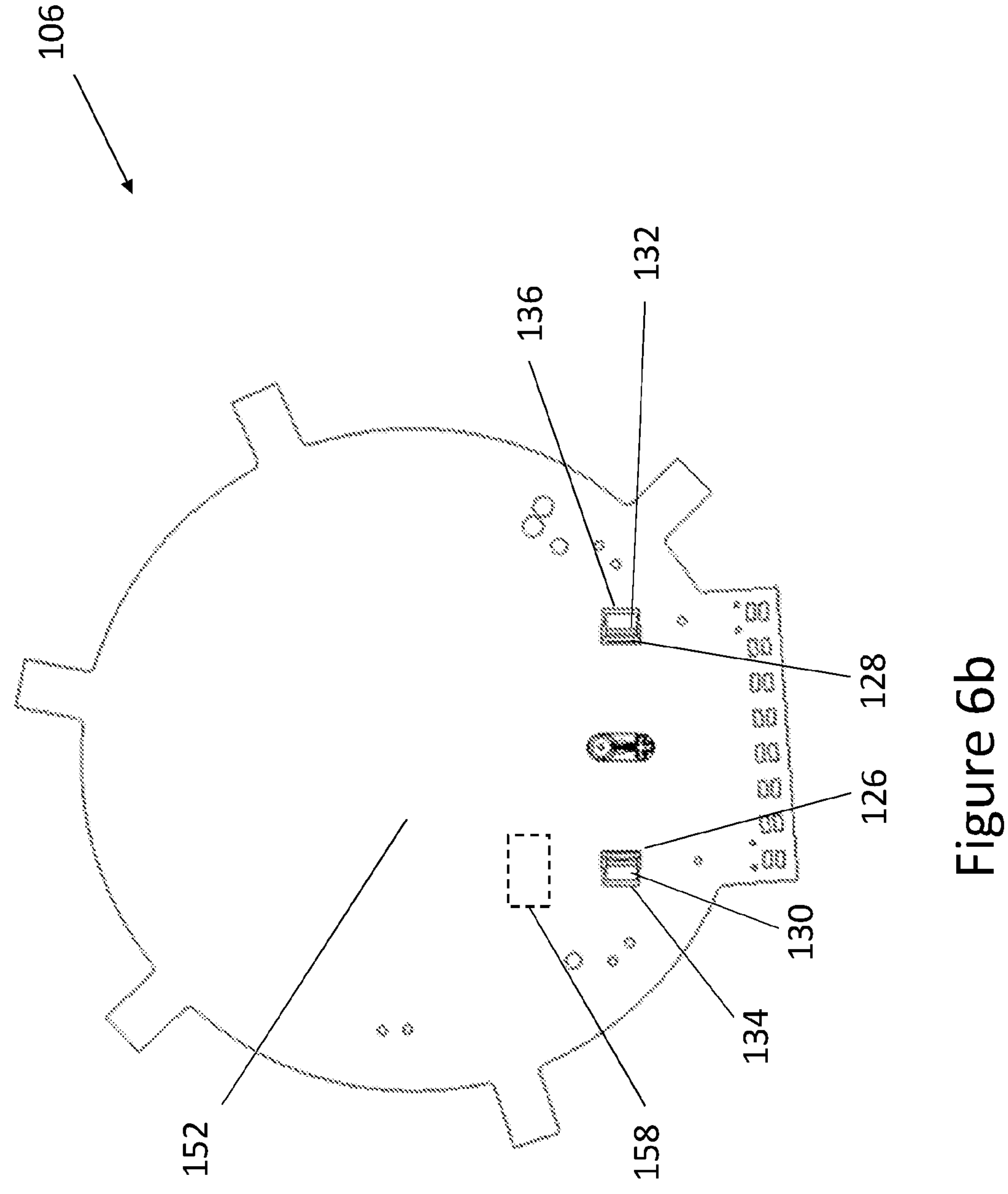
FIG. 6*b* is a bottom plan view of the assembled state of the spring bracket, sensor, and circuit board of FIG. 1.
Figure 7:
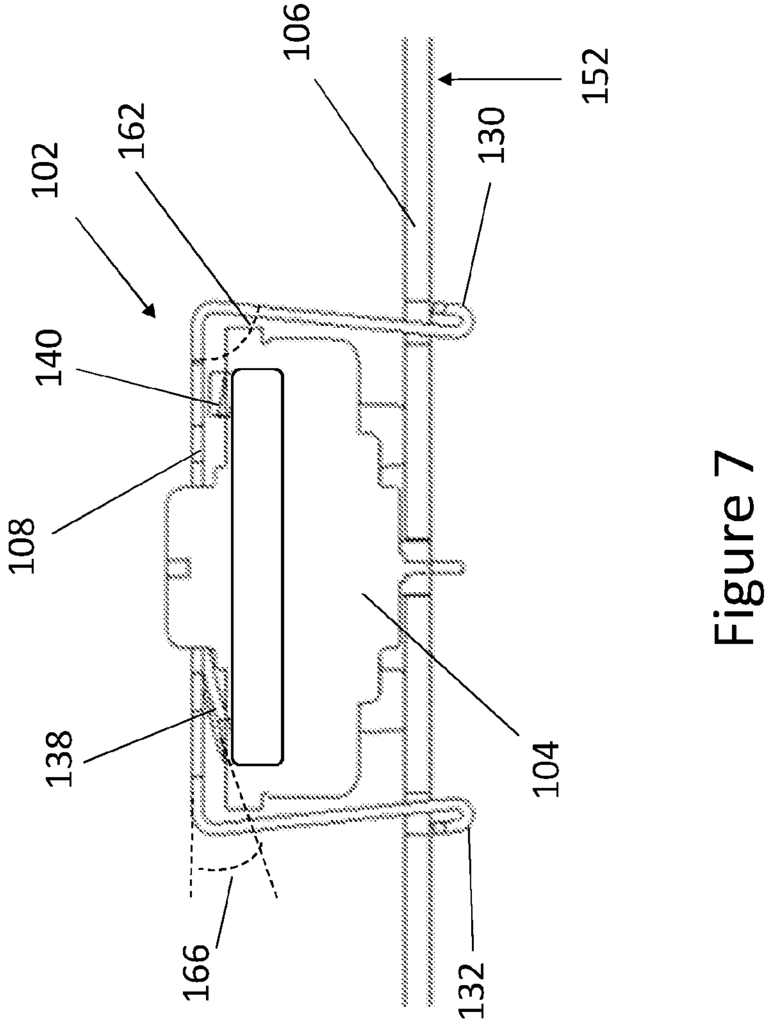
FIG. 7 is a partial cross-sectional view of the spring bracket, sensor, and circuit board of FIG. 1, during insertion of the legs of the bracket through the circuit board.
Figure 8:
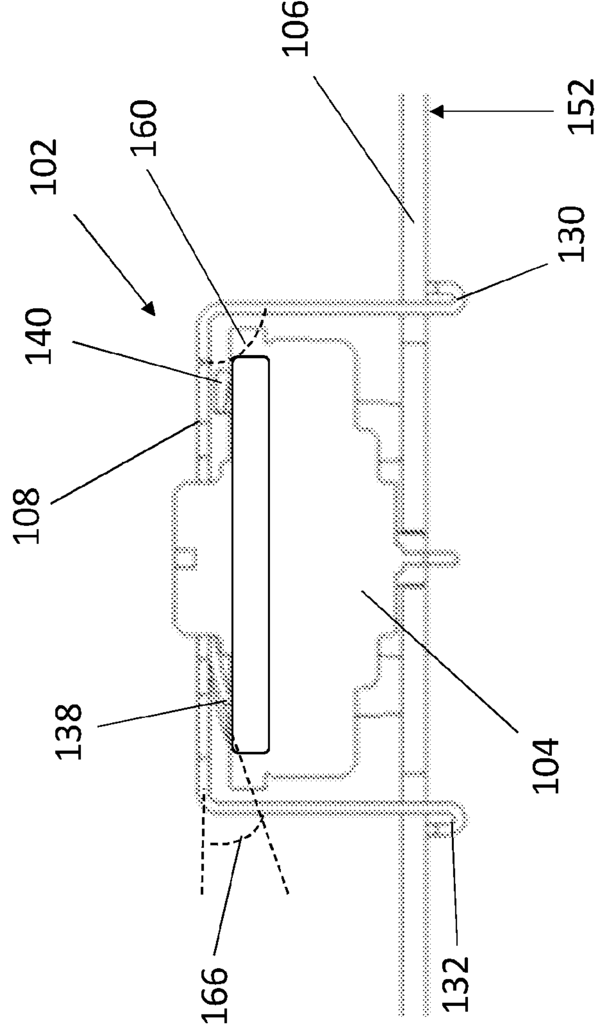
FIG. 8 is a partial cross-sectional view, along line 8-8 in FIG. 5, of the spring bracket, sensor, and circuit board of FIG. 1, with the bracket in an engaged position with the circuit board.

Referring more specifically to FIGS. 5, 7, and 8, when removably locking the sensor 104 to the circuit board 106, via the bracket 102, the sensor 104 is positioned onto the circuit board 106 and the bracket 102, 902 is then placed over the top of the sensor 104. The at least two leg portions 110, 112 are deformed at an second angle 162 (FIG. 7), which is inward relative to the main body 108 and is a smaller angle than the first angle 160 (FIG. 4*b*), to allow the respective hook members 130, 132 to extend through the openings 126, 128 in the circuit board 106. The at least two leg members 110,112 extend through the openings in the circuit board 126, 128 such that the entirety of the respective hook members 130, 132 are below the circuit board 106. As the at least two leg portions 110, 112 extend through openings 126, 128 in the circuit board 106, the first and second leaf springs 138, 140 engage the top side 124 exerting a force which presses the sensor 104 into the circuit board 106.

Further, as the first and second leaf springs 138, 140 engage the top side of the sensor 104, the first and second leaf springs 138, 140 are elastically deformed from the first angle 164 (FIG. 4*b*) to a second angle 166 (FIGS. 7 and 8), wherein the second angle 166 is smaller than the first angle 164, and wherein the first and second leaf springs 138, 140 are at a position closer to the main body 108 of the bracket 102.

Once the at least two leg portions 110, 112 extend through openings 126, 128, and the first and second leaf springs 138, 140 are in the fully engaged position, the at least two leg portions 110, 112 are released and allowed to revert back toward their original position, e.g., toward (but necessarily all the way to) the first angle 160, which is substantially normal to the main body 108 of the bracket 102. When the at least two leg portions 110, 112 are released into their original position, the outside wall of each of the at least two leg members 110, 112 engages the respective internal wall which defines the respective openings 126, 128, and the hook members 130, 132 which extend outward engage the bottom side 152 of the circuit board 106. In this engaged position, the first and second leaf springs 138, 140 exert a downward force on the sensor 104, while the hook members 130, 132 engage the bottom side 152 of the circuit board 106 and exert a force substantially opposite than that of the first and second leaf springs 138, 140.

The combination of the first and second leaf springs 138, 140 engaging the sensor 104, the hook members 130, 132 engaging the bottom side 152 of the circuit board 106, and the outside walls of each of the at least two leg members 110, 112 engaging the respective inner wall defining the respective openings 126, 128, removably lock the bracket 102 into place on the circuit board 106. This in turn removably locks the sensor 104 into place on the circuit board 106.

Figure 10:
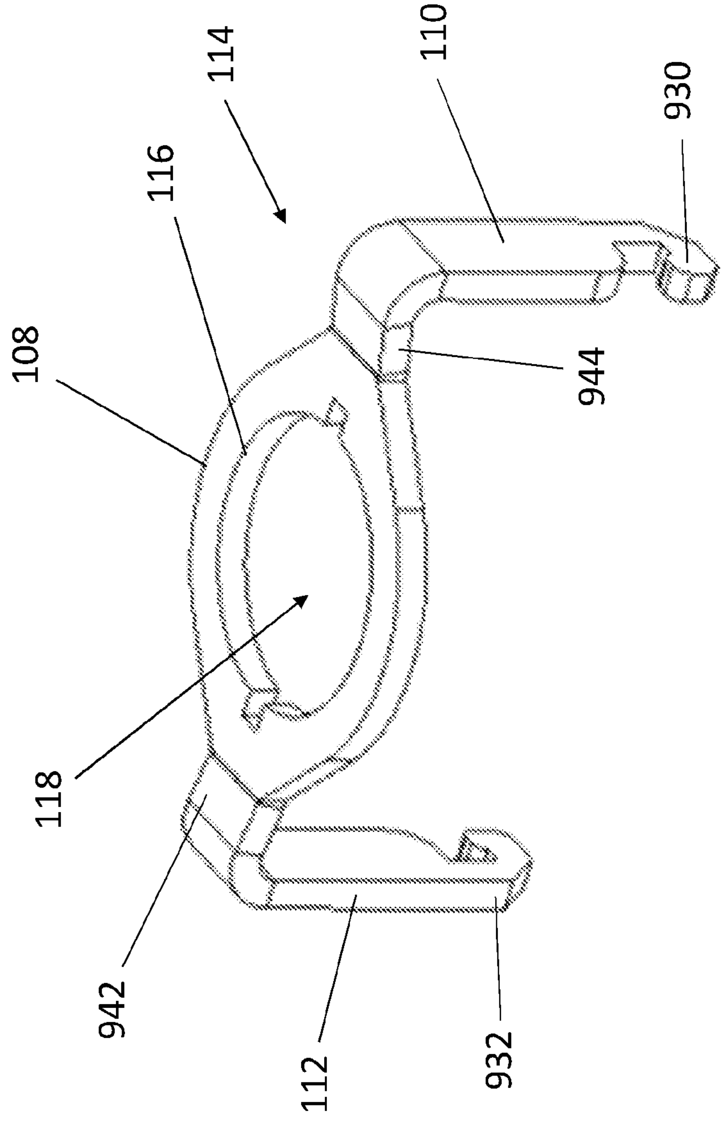
FIG. 10 is a top perspective view of the spring bracket of FIG. 9.
Figure 11:
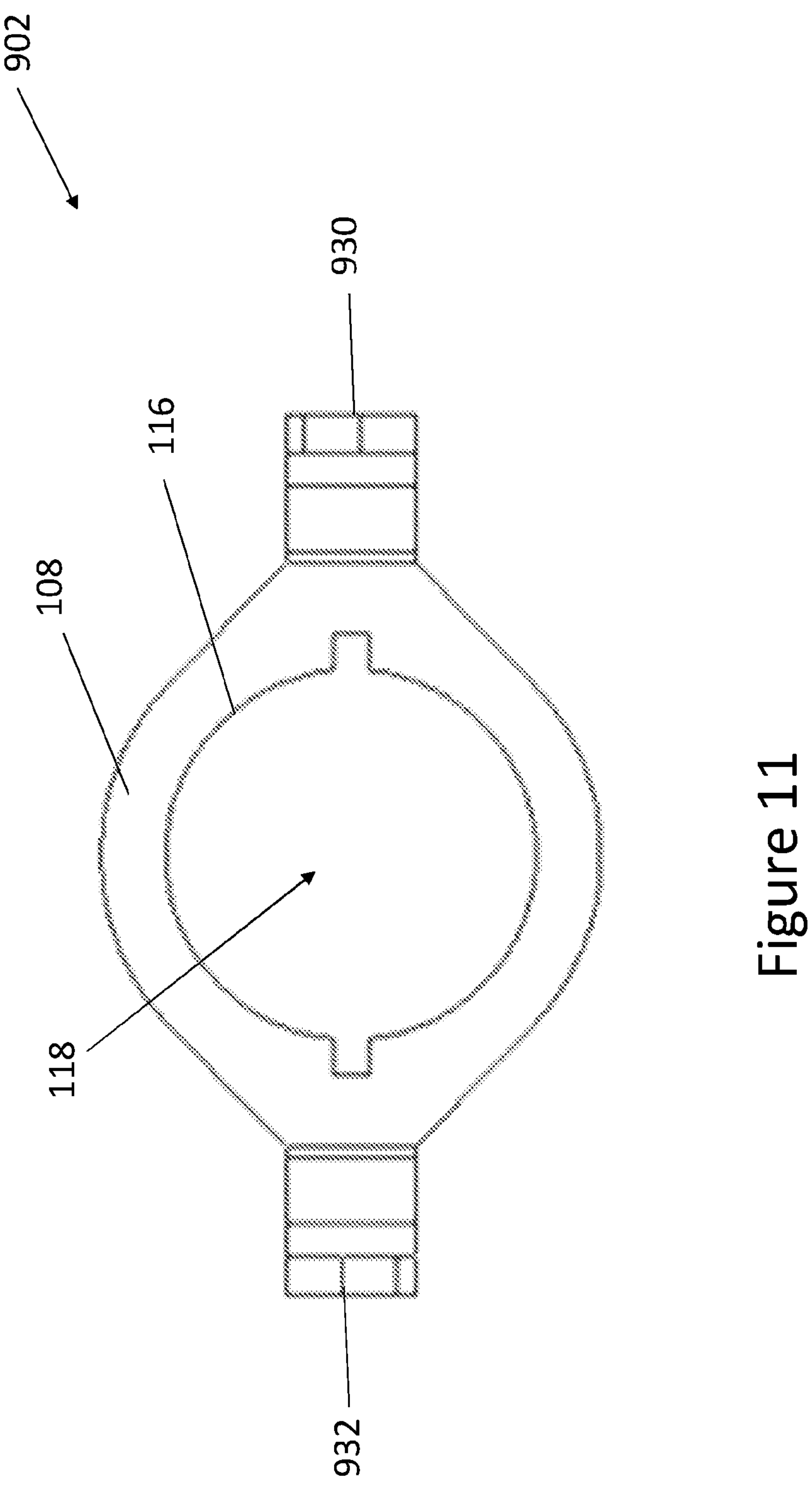
FIG. 11 is a top view of the spring bracket of FIG. 9.
Figures 12A, 12B:
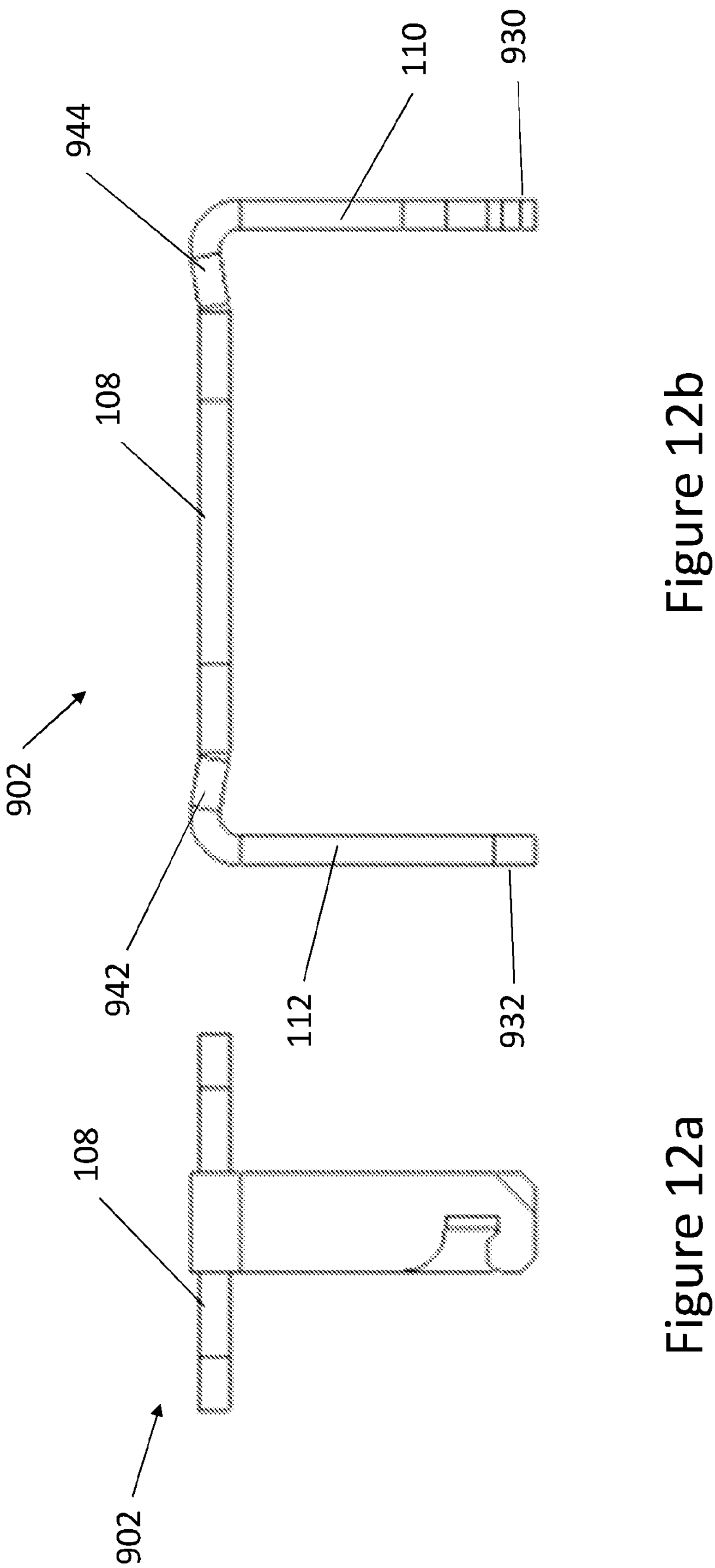
FIG. 12*a* is a side view of the spring bracket of FIG. 9.
FIG. 12*b* is a front view of the spring bracket of FIG. 9.

In the aspect of FIGS. 9-16, the at least two leg members 110, 112 are each connected to the main body 108 by respective elastically deformable attaching members 942, 944, which act as the spring member 114. In the unengaged position, the attaching members 942, 944 extend from the main body 108 of the bracket 902 at a first upward angle relative to the main body 108 as can be seen in FIG. 12*b*. Further, the second end of the at least two leg members 110, 112 each have the respective hook member 930, 932, which extends from the bottom of the second of each of the at least two leg members. The hook members 930, 932 are approximately the same width as the at least two leg members 110, 112 and form a hook or "J" shape extending from the bottom of each of the at least two leg members 110, 112 as can be seen in FIGS. 10 and 12*a*.

Figure 13:
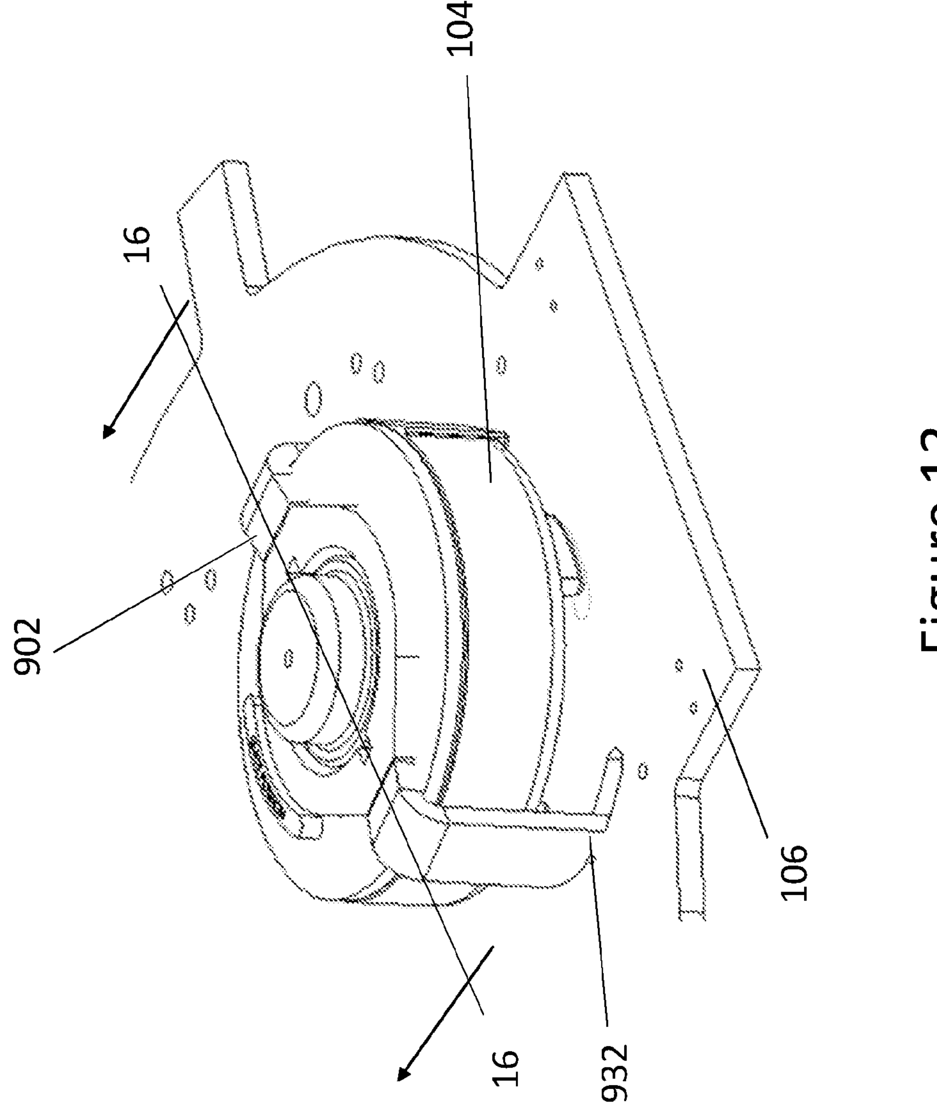
FIG. 13 is a close-up, cut-away top perspective view of the spring bracket, sensor, and circuit board of FIG. 9.
Figure 14A:
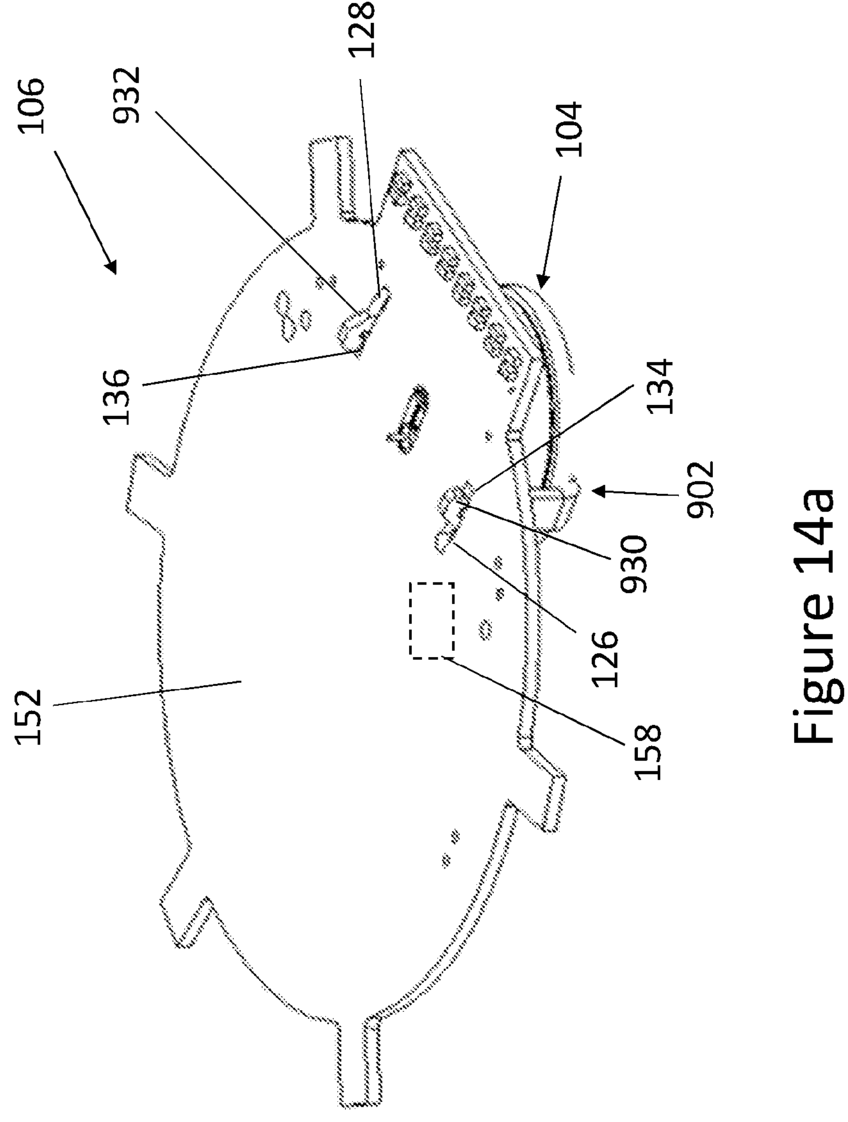
FIG. 14*a* is a bottom perspective view of the assembled state of the spring bracket, sensor, and circuit board of FIG. 9.
Figure 14B:
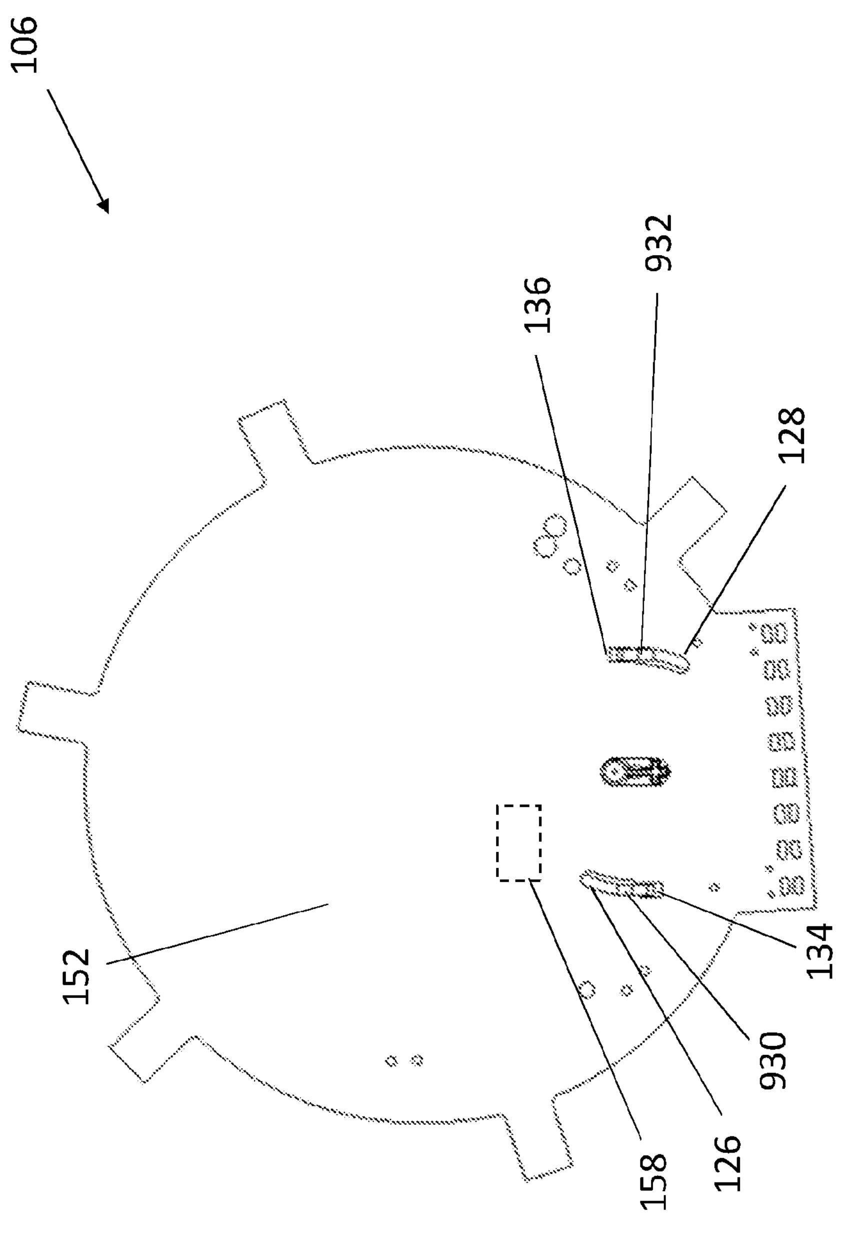
FIG. 14*b* is a bottom plan view of the assembled state of the spring bracket, sensor, and circuit board of FIG. 9.
Figure 15:
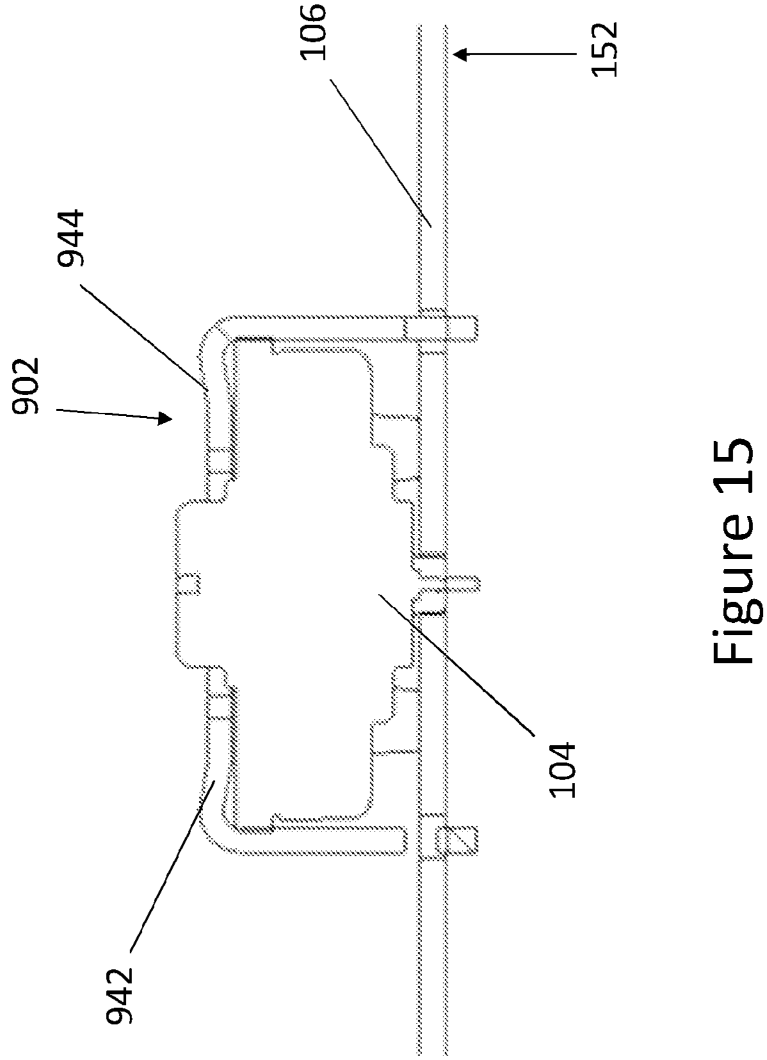
FIG. 15 is a partial cross-sectional view of the spring bracket, sensor, and circuit board of FIG. 9 in an unengaged position, similar to FIG. 16, but in an unengaged position.
Figure 16:
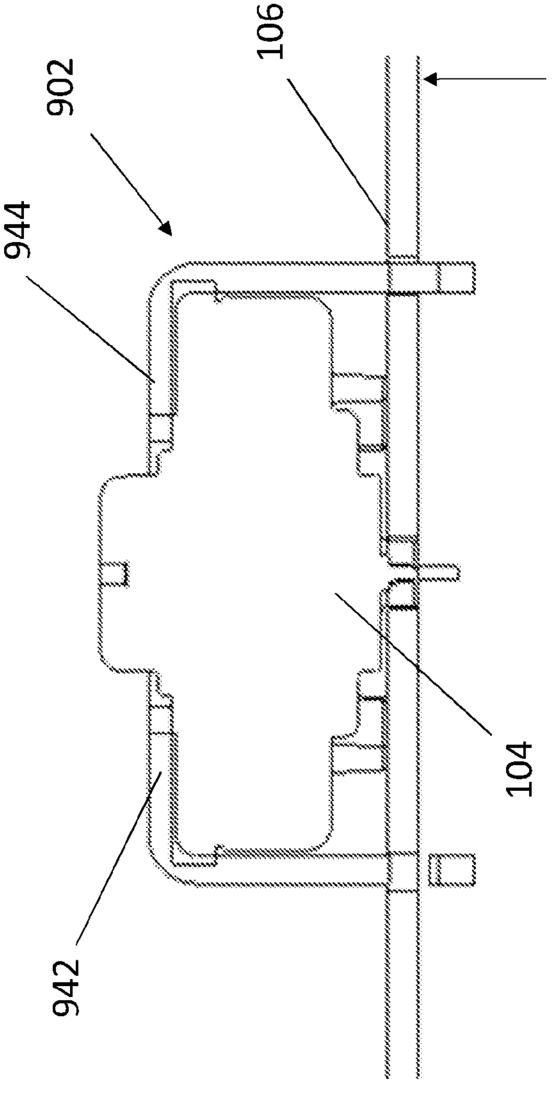
FIG. 16 is a partial cross-sectional view, such as along line 16-16 in FIG. 13, of the spring bracket, sensor, and circuit board.

Referring more specifically to FIGS. 13, 15 and 16, when removably locking the sensor 104 to the circuit board 106, the sensor 104 is positioned onto the circuit board 106 and the bracket 902 is then placed over the top of the sensor 104. The ends of the at least two leg portions 110, 112 are positioned over the respective openings in the circuit board 126, 128.

The main body 108 of the bracket 902 is then pressed downward to engage the sensor 104. This causes the attaching members 942, 944 to elastically deform such that the attaching members 942, 944 are moved to be positioned substantially parallel with the main body 108. The relative change in position of the attaching members 942, 944 during engagement of the bracket 902 with the circuit board 106 can be seen when comparing FIGS. 15 and 16, as FIG. 15 shows the bracket 902 in the unengaged position and FIG. 16 shows the bracket in the engaged position. During the engagement process, the hook members 930, 932 at the ends of the at least two leg members 110, 112 extend through the openings 126, 128 in the circuit board 106 such that the entirety of the respective hook members 930, 932 are below the circuit board.

To lock the bracket 902 and sensor 104 to the circuit board 106, the bracket 902 is then rotated in a clockwise or counterclockwise direction (depending on the orientation of the openings in the hook members 930, 932). The bracket 902 is rotated until an internal wall of each hook member 930, 932 engages the respective internal wall which defines the respective openings 126, 128 of the circuit board 106. The rotation of the bracket 902 and engagement of the hook member 930, 932 with the circuit board 106 causes the main body 108 of the bracket 902 to exert a downward force on the sensor 104 via spring force provided by the elastically deformable attaching members 942, 944, while the hook members 930, 932 engage the bottom side 152 of the circuit board 106 and exert a force substantially opposite to the force exerted by the main body 108 and/or elastically deformable attaching members 942, 944.

The combination of main body 108 engaging the sensor 104, the hook members 930, 932 engaging the bottom side 152 of the circuit board 106, and the internal walls of each of the at least two hook members 930, 932 engaging the respective internal walls which defines the respective openings of the circuit board 126, 128, in combination with the spring force provided by the elastically deformable attaching members 942, 944, lock the bracket 902 into place. This in turn locks the sensor 104 into place on the circuit board 106.

EXAMPLE IMPLEMENTATIONS

The following paragraphs include example implementations of the aspects described herein.

Example 1. A bracket for holding a sensor at a location on a circuit board, comprising:

- a main body;
- at least two leg members each including:
  - a first end connected to the main body; and
  - a second end extending away from the main body, wherein, in an engaged position of the bracket, the second end of each of the at least two leg members is configured to extend through a corresponding opening in the circuit board and wherein the second end further comprises a hook member configured to engage a bottom portion of the circuit board in the engaged position of the bracket; and
- at least one spring member having a first surface configured to contact a top portion of the sensor and exert a force substantially normal to the circuit board in the engaged position of the bracket.

Example 2. The bracket of example 1, wherein, in an unengaged position of the bracket, the hook member of each of the at least two leg members is unengaged from a bottom portion of the circuit board.

Example 3. The bracket of any of the previous examples, wherein, in the engaged position of the bracket, the hook member of each of the at least two leg members engages the bottom portion of the circuit board in opposition to the spring member that contacts the top portion of a housing member of the sensor.

Example 4. The bracket of any of the previous examples, wherein the main body further comprises an internal wall defining an opening configured to allow a portion of the sensor to extend through the opening in the main body.

Example 5. The bracket of any of the previous examples, wherein the hook members make electrical contact to electrical contact pads on a bottom side of the circuit board.

Example 6. The bracket of any of the previous examples, wherein the electrical contact is made when the bracket is in the engaged position.

Example 7. The bracket of any of the previous examples, wherein the sensor is locked into position on the circuit board when the bracket is in the engaged position.

Example 8. The bracket of any of the previous examples, wherein the sensor is a carbon monoxide (CO) cell.

Example 9. The bracket of any of the previous examples, wherein the at least one spring member includes a leaf spring extending from a portion of main body, and wherein the at least one spring member comprises a curved shape.

Example 10. The bracket of any of the previous examples, wherein the hook member of each of the at least two leg members is unengaged from a bottom side of the circuit board in the unengaged position.

Example 11. The bracket of any of the previous examples, wherein the spring member engages the top portion of the sensor and exerts a force substantially normal to the main body of the bracket, and wherein the hook member of each of the at least two leg members engages the bottom portion of the circuit board and exerts a force substantially opposite of the spring member.

Example 12. The bracket of any of the previous examples, wherein the spring member is at a first position relative to the main body of the bracket in the unengaged position, and wherein the spring member is at a second position relative the main body in the engaged position, wherein the second position is closer to the main body.

Example 13. The bracket of any of the previous examples, wherein each of the at least two leg members are positioned at a first angle substantially normal to the main body in the unengaged position, and wherein each of the at least two leg members are positioned at a second inward angle relative to the main body when the at least two leg members are being extended through the openings of the circuit board, and wherein each of the at least two leg members are returned to the first position wherein the outside of the at least two leg members engages a wall of the corresponding opening in the circuit board in the engaged position.

Example 14. The bracket of any of examples 1 to 8, wherein each of the at least two leg members is attached to the main body at their respective first end by an elastically deformable attaching member that defines the at least one spring member.

Example 15. The bracket of any of examples 1 to 8 and 14, wherein the attaching member is deformed at a second angle substantially parallel to the main body in the engaged position thereby causing the main body to exert a force substantially normal to the sensor, and wherein the hook member of each of the at least two leg members engages the bottom portion of the circuit board and exerts a force substantially opposite of the attaching member.

Example 16. The bracket of any of examples 1 to 8 and 14 and 15, wherein the bracket has a rotational first position when the bracket is unengaged, and wherein the bracket has a second rotational position either clockwise or counter-clockwise relative to the first position when the bracket is engaged, wherein the sensor is locked in place when the bracket is in the second rotational position.

Example 17. A sensor device including the bracket of any of the previous examples, comprising;

- the circuit board; and
- the sensor;
- wherein the bracket releasably mounts the sensor to the circuit board.

Example 18. The sensor device of example 17, wherein the sensor includes a sensor housing including a sensor cover and a sensor base configured to enclose the sensor and the circuit board within the sensor housing, wherein the circuit board and the sensor cover are mounted to the sensor base.

Example 19. A method of assembling a sensor device, comprising:

- positioning a bracket over a sensor device, wherein the bracket includes:
  - a main body;
  - at least one spring member connected to the main body; and
  - at least two leg members, wherein each of the at least two leg members further includes:
  - a first end connected to the main body; and a second end extending away from the main body, wherein each second end includes a hook member; and inserting each second end of the at least two leg members through a corresponding opening in a circuit board such that each hook member engages a bottom portion of the circuit board and the at least one spring member contacts a top portion of the sensor device so as to exert a force substantially normal to the circuit board onto the sensor and to position the bracket in an engaged position relative to the circuit board.

While the foregoing disclosure discusses illustrative aspects and/or embodiments, it should be noted that various changes and modifications could be made herein without departing from the scope of the described aspects and/or embodiments as defined by the appended examples. Furthermore, although elements of the described aspects and/or embodiments may be described in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A bracket for holding a sensor at a location on a circuit board, comprising:

a main body;

at least two leg members each including:

a first end connected to the main body;

a second end extending away from the main body, wherein, in an engaged position of the bracket, the second end of each of the at least two leg members is configured to extend through a corresponding opening in the circuit board and wherein the second end further comprises a hook member configured to engage a bottom portion of the circuit board in the engaged position of the bracket; and at least one spring member having a first surface configured to contact a top portion of the sensor and exert a force substantially normal to the circuit board in the engaged position of the bracket, wherein the at least one spring member, the leg members, and the hook members form a conductive path from the hook members to the at least one spring member, and the hook members are electrical contacts that contact and provide electrical continuity between contact pads on a bottom side of the circuit board and the sensor when the bracket is in the engaged position.

2. The bracket of claim 1, wherein, in an unengaged position of the bracket, the hook member of each of the at least two leg members is unengaged from a bottom portion of the circuit board.

3. The bracket of claim 1, wherein, in the engaged position of the bracket, the hook member of each of the at least two leg members engages the bottom portion of the circuit board in opposition to the at least one spring member that contacts a top portion of a housing member of the sensor, and wherein the sensor is locked into position on the circuit board when the bracket is in the engaged position.

4. The bracket of claim 1, wherein the main body further comprises an internal wall defining an opening configured to allow a portion of the sensor to extend through the opening in the main body.

5. The bracket of claim 1, wherein the sensor is a carbon monoxide (CO) cell.

6. The bracket of claim 1, wherein the at least one spring member includes a leaf spring extending from a portion of main body, and wherein the at least one spring member comprises a curved shape.

7. The bracket of claim 1, wherein the at least one spring member engages the top portion of the sensor and exerts a force substantially normal to the main body of the bracket, and wherein the hook member of each of the at least two leg members engages the bottom portion of the circuit board and exerts a force substantially opposite of the at least one spring member.

8. The bracket of claim 2, wherein the at least one spring member is at a first position relative to the main body of the bracket in the unengaged position, and wherein the at least one spring member is at a second position relative the main body in the engaged position, wherein the second position is closer to the main body.

9. The bracket of claim 8, wherein each of the at least two leg members are positioned at a first angle substantially normal to the main body in the unengaged position, and wherein each of the at least two leg members are positioned at a second inward angle relative to the main body when the at least two leg members are being extended through the corresponding openings of the circuit board, and wherein each of the at least two leg members are returned to the first position wherein an outside of the at least two leg members engages a wall of the corresponding openings in the circuit board in the engaged position.

10. The bracket of claim 1, wherein each of the at least two leg members is attached to the main body at their respective first end by an elastically deformable attaching member that defines the at least one spring member.

11. The bracket of claim 10, wherein the attaching member is deformed at an angle substantially parallel to the main body in the engaged position thereby causing the main body to exert a force substantially normal to the sensor, and wherein the hook member of each of the at least two leg members engages the bottom portion of the circuit board and exerts a force substantially opposite of the elastically deformable attaching member.

12. A bracket for holding a sensor at a location on a circuit board, comprising:

a main body;

at least two leg members each including:

a first end connected to the main body; and a second end extending away from the main body, wherein in an engaged position of the bracket, the second end of each of the at least two leg members is configured to extend through a corresponding opening in the circuit board and wherein the second end further comprises a hook member configured to engage a bottom portion of the circuit board in the engaged position of the bracket; and at least one spring member having a first surface configured to contact a top portion of the sensor and exert a force substantially normal to the circuit board in the engaged position of the bracket and the hook members are electrical contacts that contact and provide electrical continuity between contact pads on a bottom side of the circuit board and the sensor when the bracket is in the engaged position, wherein the bracket has a rotational first position when the bracket is unengaged, and wherein the bracket has a second rotational position either clockwise or counterclockwise relative to the rotational first position when the bracket is engaged, wherein the sensor is locked in place when the bracket is in the second rotational position.

13. A sensor device including the bracket of claim 1, further comprising:

the circuit board; and the sensor;

wherein the bracket releasably mounts the sensor to the circuit board.

14. The sensor device of claim 13, wherein the sensor includes a sensor housing including a sensor cover and a sensor base configured to enclose the sensor and the circuit board within the sensor housing, wherein the circuit board and the sensor cover are mounted to the sensor base.

15. A method of assembling a sensor device, comprising:

positioning a bracket over a sensor, wherein the bracket includes:

a main body;

at least one spring member connected to the main body; and at least two leg members, wherein each of the at least two leg members further includes:

a first end connected to the main body;

a second end extending away from the main body, wherein each second end includes a hook member; and inserting each second end of the at least two leg members through a corresponding opening in a circuit board such that each hook member engages a bottom portion of the circuit board and the at least one spring member contacts a top portion of the sensor so as to exert a first force substantially normal to the circuit board onto the sensor and to position the bracket in an engaged position relative to the circuit board, wherein the hook members are electrical contacts that contact electrical contact pads on a bottom side of the circuit board and provide electrical continuity with the sensor and the electrical contact pads when the bracket is in the engaged position.

16. The method of claim 15, wherein the at least two leg members are positioned at a first angle substantially normal to the main body in an unengaged position, and at a second inward angle relative to the main body when being extended through the corresponding openings of the circuit board.

17. The method of claim 15, wherein the at least one spring member comprises a leaf spring extending from a portion of the main body and having a curved shape, and wherein the first force exerted by the leaf spring presses the sensor into the circuit board.

18. The method of claim 15, further comprising enclosing the sensor and the circuit board within a sensor housing including a sensor cover and a sensor base, wherein the circuit board and the sensor cover are mounted to the sensor base.

19. The bracket of claim 1, wherein the main body, the at least two leg members, the at least one spring member, and the hook members are formed of a single piece of conductive material.

20. The method of claim 15, further comprising: rotation of the bracket about a center of the bracket after the inserting each second end of the at least two leg members through the corresponding opening so that the hook members engage with the contacts pads on the bottom side of the circuit board and provide the electrical continuity between the contact pads and the sensor.

* * * * *